US006576300B1

(12) United States Patent
Berry, III et al.

(10) Patent No.: US 6,576,300 B1
(45) Date of Patent: Jun. 10, 2003

(54) HIGH MODULUS, LOW DIELECTRIC CONSTANT COATINGS

(75) Inventors: Ivan Louis Berry, III, Ellicott City, MD (US); Kyuha Chung, Midland, MI (US); Qingyuan Han, Columbia, MD (US); Youfan Liu, Midland, MI (US); Eric Scott Moyer, Midland, MI (US); Michael John Spaulding, Essexville, MI (US)

(73) Assignees: Dow Corning Corporation, Midland, MI (US); Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/528,835

(22) Filed: Mar. 20, 2000

(51) Int. Cl.$^7$ .............................. C08J 7/18; H05H 1/24; B05D 3/02; B05D 3/06; H01L 21/4757; H01L 21/473

(52) U.S. Cl. ...................... 427/489; 427/535; 427/493; 427/536; 427/397.7; 427/397.8; 438/789

(58) Field of Search ................................ 427/489, 536, 427/539, 397.7, 397.8, 535, 493; 438/789, 793

(56) References Cited

U.S. PATENT DOCUMENTS

| | | | |
|---|---|---|---|
| 3,615,272 A | | 10/1971 | Collins et al. |
| 4,636,440 A | | 1/1987 | Jada |
| 4,749,631 A | | 6/1988 | Haluska et al. |
| 4,756,977 A | | 7/1988 | Haluska et al. |
| 4,808,653 A | | 2/1989 | Haluska et al. |
| 4,822,697 A | | 4/1989 | Haluska et al. |
| 4,842,888 A | | 6/1989 | Haluska et al. |
| 4,847,162 A | | 7/1989 | Haluska et al. |
| 4,885,186 A | * | 12/1989 | Bagley et al. ............... 427/539 |
| 4,905,117 A | | 2/1990 | Beg |
| 4,999,397 A | | 3/1991 | Weiss et al. |
| 5,008,320 A | | 4/1991 | Haluska et al. |
| 5,010,159 A | | 4/1991 | Bank et al. |
| 5,063,267 A | | 11/1991 | Hanneman et al. |
| 5,116,637 A | | 5/1992 | Baney et al. |
| 5,145,723 A | * | 9/1992 | Ballance et al. .......... 427/397.7 |
| 5,210,160 A | | 5/1993 | Saive et al. |
| 5,262,201 A | | 11/1993 | Chandra et al. |
| 5,290,394 A | | 3/1994 | Sasaki |
| 5,416,190 A | | 5/1995 | Mine et al. |
| 5,456,952 A | * | 10/1995 | Garza et al. ................. 427/489 |
| 5,523,163 A | | 6/1996 | Ballance et al. |
| 5,547,703 A | | 8/1996 | Camilletti et al. |
| 5,567,658 A | * | 10/1996 | Wang et al. ................. 427/539 |
| 5,618,878 A | | 4/1997 | Syktich et al. |
| 5,770,260 A | * | 6/1998 | Fukuyama et al. ......... 427/539 |
| 5,961,851 A | | 10/1999 | Kamarehi et al. |
| 6,054,206 A | | 4/2000 | Mountsier |
| 6,143,360 A | * | 11/2000 | Zhang ........................ 427/244 |
| 6,171,703 B1 | * | 1/2001 | Haluska ...................... 427/489 |
| 6,287,990 B1 | * | 9/2001 | Cheung et al. ............. 427/489 |
| 6,303,192 B1 | * | 10/2001 | Annapragada et al. ...... 427/539 |

FOREIGN PATENT DOCUMENTS

| | | |
|---|---|---|
| EP | 1003210 A | 5/2000 |
| JP | 59-178749 | 10/1984 |
| JP | 63-107122 | 5/1988 |
| JP | 60-86017 | 3/1994 |
| WO | WO 99 21706 A | 5/1999 |

OTHER PUBLICATIONS

Glasser et al.; Effect of the H20/TEOS Ratio Upon the Preparation and Nitridation of Silica SOL/GEL Films; Journal of Non–Crystalline Solids, 1984; 13 pgs.; vol. 63; Elsevier Science Publishers B.V.; North–Holland, Amsterdam, no month.

* cited by examiner

Primary Examiner—Marianne Padgett
(74) Attorney, Agent, or Firm—Killworth, Gottman, Hagan & Schaeff, L.L.P.

(57) ABSTRACT

Low dielectric constant films with improved elastic modulus. The method of making such coatings involves providing a porous network coating produced from a resin containing at least 2 Si—H groups where the coating has been thermally cured and has a dielectric constant in the range of from about 1.1 to about 3.5, and plasma treating the coating to convert the coating into porous silica. Plasma treatment of the network coating yields a coating with improved modulus, but with a higher dielectric constant. The coating is plasma treated for between about 15 and 120 seconds at a temperature less than or about 350° C. The plasma treated coating can optionally be annealed. Rapid thermal processing (RTP) of the plasma treated coating reduces the dielectric constant of the coating while maintaining an improved elastic modulus as compared to the initial porous coating. The annealing temperature is preferably in excess of or about 350° C., and the annealing time is preferably at least or about 120 seconds. The annealed, plasma treated coating has a dielectric constant in the range of from about 1.1 to about 2.4 and an improved elastic modulus.

19 Claims, No Drawings

HIGH MODULUS, LOW DIELECTRIC CONSTANT COATINGS

BACKGROUND

This invention relates generally to coatings for use in electronic devices. More particularly, the invention relates to coatings having an improved elastic modulus and a low dielectric constant and to methods of making such coatings.

Thin film dielectric coatings on electric devices are known in the art. For instance, U.S. Pat. Nos. 4,749,631 and 4,756,977, to Haluska et al., which are incorporated herein by reference, disclose silica based coatings produced by applying solutions of silicon alkoxides or hydrogen silsesquioxane, respectively, to substrates and then heating the coated substrates to temperatures of 200–1000° C. The dielectric constant of these coatings are often too high for certain electronic devices and circuits.

U.S. Pat. Nos. 4,847,162 and 4,842,888, to Haluska et al., teach the formation of nitrided silica coatings by heating hydrogen silsesquioxane resin and silicate esters, respectively, to temperatures in the range of between about 200 and 1000° C. in the presence of ammonia. These references teach the use of anhydrous ammonia so that the resulting coating has about 1 to 2% by weight nitrogen incorporated therein.

Glasser et al., Journal of Non-Crystalline Solids, 64 (1984) pp. 209–221, teaches the formation of ceramic coatings by heating tetraethoxysilane in the presence of ammonia. This reference teaches the use of anhydrous ammonia and that the resulting silica coatings are nitrided. U.S. Pat. No. 4,636,440, to Jada, discloses a method of reducing the drying time for a sol-gel coated substrate comprising exposing the substrate to aqueous quaternary ammonium hydroxide and/or alkanol amine compounds. Jada requires that the coating be dried prior to heating. It is specifically limited to hydrolyzed or partially hydrolyzed silicon alkoxides and does not teach the utility of the process on coatings having Si—H bonds.

U.S. Pat. Nos. 5,262,201, to Chandra, and 5,116,637, to Baney et al., teach the use of basic catalysts to lower the temperature necessary for the conversion of various preceramic materials, all involving hydrogen silsesquioxane, to ceramic coatings. These references teach the removal of solvent before the coating is exposed to the basic catalysts.

U.S. Pat. No. 5,547,703, to Camilletti et al., teaches a method for forming low dielectric constant Si—O containing coatings on substrates comprising heating a hydrogen silsesquioxane resin successively under wet ammonia, dry ammonia, and oxygen. The resultant coatings have dielectric coatings as low as 2.42 at 1 MHz. This reference teaches the removal of solvent before converting the coating to a ceramic.

U.S. Pat. No. 5,523,163, to Balance et al., teaches a method for forming Si—O containing coatings on substrates comprising heating a hydrogen silsesquioxane resin to convert it to a Si—O containing ceramic coating and then exposing the coating to an annealing atmosphere containing hydrogen gas. The resultant coatings have dielectric constants as low as 2.773. The reference teaches the removal of solvent before converting the coating to a ceramic.

U.S. Pat. No. 5,618,878, to Syktich et al., discloses coating compositions containing hydrogen silsesquioxane resin dissolved in saturated alkyl hydrocarbons useful for forming thick ceramic coatings. The alkyl hydrocarbons disclosed are those up to dodecane. The reference does not teach exposure of the coated substrates to basic catalysts before solvent removal.

U.S. Pat. No. 6,231,989, to Chung et al., entitled METHOD OF FORMING COATINGS, which is incorporated herein by reference, discloses a method of making porous network coatings with low dielectric constants. The method comprises depositing a coating on a substrate with a solution comprising a resin containing at least 2 Si—H groups and a solvent in a manner in which at least 5 volume % of the solvent remains in the coating after deposition. The coating is then exposed to an environment comprising a basic catalyst and water. Finally, the solvent is evaporated from the coating to form a porous network. The coating can be cured by heating to form a ceramic if desired. Films made by this process have dielectric constants in the range of 1.5 to 2.4 with an elastic modulus of about 2–3 GPa.

However, there is a need for coating with an elastic modulus of greater than or about 4 GPa and a low dielectric constant.

SUMMARY OF THE INVENTION

The present invention produces a coating with a low dielectric constant and an improved elastic modulus. The method of making the coating involves providing a porous network coating produced from a resin containing at least 2 Si—H groups. The coating is plasma treated to reduce the amount of SiH bonds remaining in the coating. Plasma treatment of the porous network coating yields a coating with improved elastic modulus. The increase in the elastic modulus is preferably at least 50%, and more preferably at least 100%.

The plasma treated coating can optionally be annealed. Thermal annealing of the plasma treated coating reduces the dielectric constant of the coating while maintaining an increase in the elastic modulus as compared to the initial elastic modulus of the coating. The annealing temperature is preferably in excess of or about 350° C., and the annealing time is preferably at least or about 120 seconds.

The porous network coating can be thermally cured prior to plasma treatment. In this case, the porous network coating is preferably heated to a temperature in the range of from about 50° C. to about 1000° C. for up to 6 hours.

The annealed, plasma treated coating has a dielectric constant in the range of from about 1.1 to about 3.5 and an improved elastic modulus.

Accordingly, it is an object of the present invention to produce coatings having improved elastic modulus and low dielectric constant.

DETAILED DESCRIPTION OF THE INVENTION

The manufacture of ultra low dielectric constant coatings having a dielectric constant of about 1.5 to 2.4 is described in U.S. Pat. No. 6,231,989, which has been incorporated herein by reference. This patent describes a process in which pores are introduced into hydrogen silsesquioxane (HSQ) based films. HSQ based films which have been cured under thermal conditions contain about 20 to 60% SiH bonds density. When the dielectric constant of the coating is about 2.0, the coating has an elastic modulus of about 2–3 GPa. The present invention is based on the discovery that plasma treating porous HSQ based films increases the elastic modulus of the film. Applying a plasma treatment to thermally cured HSQ based films or HSQ films which have not been thermally cured reduces the amount of SiH bonds remaining without losing t he low density structure of the film.

The plasma treated films show improved elastic modulus as compared with the untreated coatings. However, the plasma treatment can generate a notable amount of polar species in the film, resulting in an increase in the dielectric constant. This can be undesirable in some applications. The present invention is also based on the discovery that applying thermal annealing to plasma treated coatings produces a low dielectric constant, improved modulus material.

The methods of the present invention are particularly applicable to the deposition of coatings on electronic devices or electronic circuits where they can serve as interlevel dielectric layers, doped dielectric layers to produce transistor like devices, pigment loaded binder systems containing silicon to produce capacitor and capacitor like devices, multilayer devices, 3-D devices, silicon on insulator devices, super lattice devices, and the like. However, the choice of substrates and devices to be coated by the instant invention is limited only by the need for thermal and chemical stability of the substrate at the temperature and pressure used in the present invention. As such, the coatings of the present invention can be used on substrates such as plastics including, for example, polyimides, epoxies, polytetrafluoroethylene and copolymers thereof, polycarbonates, acrylics and polyesters, ceramics, leather, textiles, metals, and the like.

As used in the present invention, the expression "ceramic" includes ceramics such as amorphous silica and ceramic-like materials such as amorphous silica-like materials that are not fully free of carbon and/or hydrogen but are otherwise ceramic in character. The expressions "electronic device" or "electronic circuit" include, but are not limited to, silica-based devices, gallium arsenide based devices, silicon carbide based devices, focal plane arrays, opto-electronic devices, photovoltaic cells and optical devices.

A porous network coating is needed as a starting material for the present invention. One method of making such a porous network coating is disclosed in U.S. Pat. No. 6,231,989, which is described below.

The method of producing the porous network coating starts with depositing a coating on a substrate with a solution comprising a resin containing at least 2 Si—H groups and a solvent. The resins containing at least 2 Si—H groups are not particularly limited as long as the Si—H bonds can be hydrolyzed and at least partially condensed by the basic catalyst and water to form a crosslinked network which serves as the structure for the porous network. Generally, such materials have the formula:

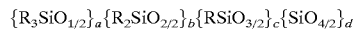

wherein each R is independently selected from the group consisting of hydrogen, alkyl, alkenyl, or aryl groups, or alkyl, alkenyl, or aryl groups substituted with a hetero atom such as a halogen, nitrogen, sulfur, oxygen, or silicon, and a, b, c, and d are mole fractions of the particular unit and their total is 1, with the proviso that at least 2 R groups per molecule are hydrogen and the material is sufficiently resinous in structure to form the desired network. Examples of alkyl groups are methyl, ethyl, propyl, butyl, and the like, with alkyls of 1–6 carbons preferred. Examples of alkenyl groups include vinyl, allyl, and hexenyl. Examples of aryls include phenyl. Examples of substituted groups include $CF_3(CF_2)_nCH_2CH_2$, where n=0–6.

Particularly preferred in the present invention are various hydridosiloxane resins, known as hydrogen silsesquioxane resins, comprising units of the formula $HSi(OH)_x(OR)_yO_{z/2}$. In this formula, each R is as defined above. When these R groups are bonded to silicon through the oxygen atom, they form a hydrolyzable substituent. In the above formula, x=0 to 2, y=0 to 2, z=1 to 3, an x+y+z=3. These resins may be essentially fully condensed $(HSiO_{3/2})_n$ where n is 8 or greater, or they may be only partially hydrolyzed (i.e., containing some Si—OR), and/or partially condensed (i.e., containing some Si—OH).

The structure of the resin is not limited. The structure may be what is generally known as ladder-type, cage-type, or mixtures thereof. The resins may contain endgroups such as hydroxyl groups, triorganosiloxy groups, diorganohydrogensiloxy groups, trialkoxy groups, dialkoxy groups and others. Although not represented by the structure, the resin may also contain a small number (e.g., less than 10%) of the silicon atoms which have either 0 or 2 hydrogen atoms attached thereto and/or a small number of SiC groups, such as $CH_3SiO_{3/2}$ or $HCH_3SiO_{2/2}$ groups.

The above resins containing at least 2 Si—H groups and methods for their production are known in the art. For example, U.S. Pat. No. 3,615,272, to Collins, incorporated herein by reference, teaches the production of an essentially fully condensed hydrogen silsesquioxane resin (which may contain up to 100–300 ppm silanol) by a process comprising hydrolyzing trichlorosilane in a benzenesulfonic acid hydrate hydrolysis medium, and then washing the resulting resin with water or aqueous sulfuric acid. Similarly, U.S. Pat. No. 5,010,159 to Bank, incorporated herein by reference, teaches a method comprising hydrolyzing hydridosilanes in an arylsulfonic acid hydrate hydrolysis medium to form a resin which is then contacted with a neutralizing agent.

Other hydridosiloxane resins, such as those described in U.S. Pat. No. 4,999,397, to Fry, and U.S. Pat. No. 5,210,160, to Bergstrom, which are incorporated herein by reference, those produced by hydrolyzing an alkoxy or acyloxy silane in an acidic, alcoholic hydrolysis medium, those described in Japanese Kokai Pat. Nos. 59-178749, 60-86017, and 63-107122, or any other equivalent hydridosiloxanes, will also function herein.

In a preferred embodiment of the invention, specific molecular weight fractions of the above hydrogen silsesquioxane resins may also be used. Such fractions and methods for their preparation are taught in U.S. Pat. No. 5,063,267, to Hanneman, and U.S. Pat. No. 5,416,190, to Mine, which are incorporated herein by reference. A preferred fraction comprises material wherein at least 75% of the polymeric species have a number average molecular weight above about 1200, and a more preferred fraction comprises material wherein at least 75% of the polymeric species have a number average molecular weight between about 1200 and about 100,000.

The hydrogen silsesquioxane resin may contain other components as long as these components do not interfere with the integrity of the coating. It should be noted, however, that certain materials may increase the dielectric constant of the coating. Known additives include catalysts such as platinum, rhodium, or copper catalyst which increase the rate and/or extent of cure of the resin, as described in U.S. Pat. No. 4,822,697, to Haluska, which is incorporated herein by reference.

Ceramic oxide precursors may also be used in combination with the hydrogen silsesquioxane resin. The ceramic oxide precursors useful herein include compounds of various metals such as aluminum, titanium, zirconium, tantalum, niobium and/or vanadium, as well as various non-metallic compounds, such as those of boron or phosphorus, which may be dissolved in solution, hydrolyzed and subsequently pyrolyzed at relatively low temperature to form ceramic oxides. Ceramic oxide precursors useful herein are described in U.S. Pat. Nos. 4,808,653, 5,008,320, and 5,290,394, which are incorporated herein by reference.

The above Si—H containing resins are applied to the substrates as solvent dispersions. Solvents which may used include any agent or mixture of agents which will dissolve or disperse the resin to form a homogeneous liquid mixture without affecting the resulting coating or the substrate. These solvents can include alcohols, such as ethyl alcohol or isopropyl alcohol; aromatic hydrocarbons, such as benzene or toluene; branched or linear alkanes, such as n-heptane, dodecane, or nonane; branched or linear alkenes, such as n-heptene, dodecene or tetradecene; ketones, such as methyl isobutyl ketone; esters; ethers, such as glycol ethers; or linear or cyclic siloxanes, such as hexamethyldisiloxane, octamethyldisiloxane, and mixtures thereof, or cyclic dimethylpolysiloxanes; or mixtures of any of the above solvents. The solvent is generally present in an amount sufficient to dissolve/disperse the resin to the concentration desired for application. Typically, the solvent is present in an amount of 20 to 99.9 wt %, preferably from 70 to 95 wt % based on the weight of the resin and solvent.

If desired, other materials can be included in the resin dispersion. For instance, the dispersion can include fillers, colorants, adhesion promoters, and the like.

Specific methods for application of the resin dispersion to the substrate include, but are not limited to, spin coating, dip coating, spray coating, flow coating, screen printing, or others. The preferred method is spin coating.

At least 5 volume % of the solvent should remain in the coating until the resin is contacted with the basic catalyst and water. This solvent forms the pores of the porous network coating as the Si—H bonds are hydrolyzed and condensed. In some embodiments, it may be preferable that at least 10 volume % solvent remains, while in others, it may be preferable that at least 15 volume % solvent remains, and in still others, it may be preferable that at least about 25 volume % solvent remains.

The method of retaining the solvent is not particularly restricted. In a preferred embodiment, a high boiling point solvent can be used alone or as a co-solvent with one of the solvents described above. In this manner, processing the resin dispersion as described above under normal conditions allows for at least 5% residual solvent remaining. Preferred high boiling solvents in this embodiment are those with boiling points above 175° C. including hydrocarbons, aromatic hydrocarbons, esters, ethers, and the like. Examples of specific solvents which can be used in this embodiment include saturated hydrocarbons, such as dodecane, tetradecane, hexadecane, etc., unsaturated hydrocarbons such as dodecene, tetradecene, etc., xylenes, mesitylene, 1-heptanol, dipentene, d-limonene, tetrahydrofurfuryl alcohol, mineral spirits, 2-octanol, stoddard solvent, Isopar H™, diethyl oxalate, diamyl ether, tetrahydropyran-2-methanol, lactic acid butyl ester, isooctyl alcohol, propylene glycol, dipropylene glycol monomethyl ether, diethylene glycol diethyl ether, dimethyl sulfoxide, 2,5-hexanedione, 2-butoxyethanol acetate, diethylene glycol monomethyl ether, 1-octanol, ethylene glycol, Isopar L™, dipropylene glycol monomethyl ether acetate, diethylene glycol monoethyl ether, N-methylpyrrolidone, ethylene glycol dibutyl ether, gamma-butyrolactone, 1,3-butanediol, diethylene glycol monomethyl ether acetate, trimethylene glycol, triethylene glycol dimethyl ether, diethylene glycol monoethyl ether acetate, alpha-terpineol, n-hexyl ether, kerosene, 2-(2-n-butoxyethoxy)ethanol, dibutyl oxalate, propylene carbonate, propylene glycol monophenyl ether, diethylene glycol, catechol, diethylene glycol monobutyl ether acetate, ethylene glycol monophenyl ether, diethylene glycol dibutyl ether, diphenyl ether, ethylene glycol monobenzyl ether, hydroquinone, sulfolane, and triethylene glycol. Hydrocarbon solvents are particularly preferred.

The above processing (i.e., primarily deposition of the coating solution) can be done in an environment which inhibits solvent evaporation prior to contact with the basic catalyst and water. for example, the spin coating can be performed in a closed environment such that the subsequent steps (i.e., contact with the basic catalyst and water) can occur before the solvent is completely evaporated.

The coating containing at least 5 volume % solvent is then contacted with a basic catalyst and water. Examples of basic catalysts include ammonia, ammonium hydroxide, as well as amines. The amines useful herein may include primary amines ($RNH_2$), secondary amines ($R_2NH$), and/or tertiary amines ($R_3N$) in which R is independently a saturated or unsaturated aliphatic, such as methyl, ethyl, propyl, vinyl, allyl, ethynyl, etc.; an alicyclic, such as cyclohexylmethyl; an aromatic, such as phenyl; a substituted hetero atom, such as oxygen, nitrogen, sulfur, etc.; or compounds in which the nitrogen atom is a member of a heterocyclic ring such as quinoline, pyrrolidine, or pyridine. In addition, any of the above amine compounds may be substituted with other hydrocarbon and/or hetero containing groups to form compounds such as diamines, amides, etc. Finally, it is also contemplated that compounds which are converted to amines under the reactions conditions used would function in an equivalent manner. For example, a compound such as an ammonium salt which yields an amine upon dissolution would provide the desired catalytic effect.

Examples of the amines that may used herein include methylamine, ethylamine, butylamine, allylamine, cyclohexylamine, aniline, dimethylamine, diethylamide, dioctylamine, dibutylamine, methylethylamine, saccharin, piperidine, trimethylamine, triethylamine, pyridine, diethyl toluidene ethylmethylpropylamine, imidazole, choline acetate, triphenyl phosphene analine, trimethylsilylimidazole, ethylenediamine, diethylhydroxylamine, triethylenediamine, n-methylpyrolidone, etc.

The basic catalyst can generally be used at any concentration sufficient to catalyze hydrolysis of the Si—H bonds. Generally, concentrations of the basic catalyst can be from 1 ppm to 100 wt % based on the weight of the resin, depending on(the basic catalyst.

The water used can be that present in the ambient environment (e.g., >25% relative humidity), the ambient environment can be supplemented with additional water vapor (e.g., relative humidity up to 100%), water can be used as a liquid, or a compound which generates water under the reaction conditions can be used.

Contact of the coating with the basic catalyst and water can be accomplished by any means practical or desirable. For instance, the coating can be contacted with vapors of the basic catalyst and water vapor. Alternatively, the coating can be contacted with the basic catalyst and water in the liquid state, such as by immersing the coating in an ammonium hydroxide solution.

The resin coating is preferably exposed to an environment comprising the basic catalyst and water in the vapor state, more preferably ammonia and water vapor. For instance, the coated substrate may be placed in a container and the appropriate environment introduced therein, or a stream of the basic catalyst and water may be directed at the coating.

The method used to generate the basic catalyst and water environment is generally not significant in the preferred embodiment. Methods such as bubbling the basic catalyst (e.g., ammonia gas) through water or ammonium hydroxide solutions (to control the amount of water vapor present), heating a basic catalyst and water, or heating water and introducing the basic catalyst gas (e.g., ammonia gas) are all functional herein. It is also contemplated that methods which generate basic catalyst vapors in situ, such as the addition of water to amine salts or the addition of water to a silazane such as hexamethyldisilazane will also be effective.

The basic catalyst used may be at any concentration desired. For example, the concentration may be from about 1 ppm up to a saturated atmosphere.

The exposure can be at any temperature desired from room temperature up to about 300° C. A temperature in the range of from about 20° C. to about 200° C. is preferred, with a range of from about 20° C. to about 100° C. being more preferred.

The resin coating should be exposed to the basic catalyst and water environment for the time necessary to hydrolyze the Si—H groups to form silanols (Si—OH) and for the silanols to at least partially condense to form Si—O—Si bonds. Generally, exposures of up to about 20 minutes are preferred, with exposures of at least about 1 second up to about 5 minutes being more preferred. If the coatings are to be used as a dielectric layer, it is generally preferred to have a shorter exposure, as longer exposures tend to increase the dielectric constant of the coating.

When the coating is exposed to the basic catalyst and water in the liquid state, the exposure is usually conducted by immersing the coated substrate in a solution. Other equivalent methods can be used, such as flushing the coating with a basic catalyst and water solution would function as well. In addition, vacuum infiltration may also be used to increase penetration of the basic catalyst and water into the coating.

The basic catalyst solution used in this embodiment may be at any concentration desired. Generally when ammonium hydroxide is used, a concentrated aqueous solution (28–30%) is preferred since the duration of exposure is thereby shortened. When dilute solutions are used, the diluent is generally water.

Exposure to the basic catalyst and water solution in this embodiment may be conducted at any temperature and pressure desired. Temperatures from about room temperature (20–30° C.) up to about the boiling point of the basic catalyst solution, and pressures from below to above atmospheric are all contemplated herein. From a practical standpoint, it is preferred that the exposure occur at about room temperature and at about atmospheric pressure.

The resin coating is exposed to the basic catalyst solution in this embodiment for the time necessary to hydrolyze the Si—H groups to form silanols (Si—OH) and for the silanols to at least partially condense to form Si—O—Si bonds. Generally, exposures of up to about 2 hours are preferred, with exposures of at least about 1 second up to about 15 minutes being more preferred.

Alternatively, the coating may be exposed to both a liquid basic catalyst and water environment (e.g., ammonium hydroxide) and a gaseous basic catalyst and water vapor environments (ammonia gas and water vapor). The exposures may be either sequential or simultaneous, and are generally under the same conditions as those described above.

After the resin is exposed to one of the above environments, the solvent is then removed from the coating. This can be accomplished by any desired means. For instance, the coating can be heated to complete the condensation of silanols formed.

The coating produced by this process can be used as the starting material in the present invention. Alternatively, it can be thermally cured if desired. Porous network coatings which have not been thermally cured have the advantage of having a lower thermal budget, or thermal history, than cured films.

If a cured coating is desired, the coating can be thermally cured by heating to a temperature sufficient to convert the coating to a ceramic either before, during, or after solvent removal. Generally, the temperature is above room temperature, in the range of from about 50° to about 1000° C. A preferred temperature range is about 500° C. to about 500° C., with a range of about 200° C. to about 500° C. being more preferred, and a range of about 350° C. to about 450° C. being most preferred. Higher temperatures usually result in quicker and more complete conversion to a ceramic, but these temperatures can have detrimental effects on the various temperature sensitive substrates. The coatings are usually subjected to these temperatures for a time sufficient to ceramify the coating, generally up to.or about 6 hours, with a range of between about 5 minutes and 6 hours being preferred, and a range of between about 10 minutes and 2 hours being more preferred.

The heating may be conducted at any effective atmospheric pressure from vacuum to superatmospheric and under any effective gaseous environment, such as an inert gas ($N_2$, etc.). It is especially preferred to heat under a nitrogen atmosphere.

Any method of heating, such as the use of a convection oven or radiant or microwave heat, is generally functional herein. The rate of heating is not critical, but it is most practical and preferred to heat as rapidly as possible.

The resin coating may be simultaneously exposed to the basic catalyst and water environment (liquid or gaseous) and subjected to a temperature sufficient to convert it to a ceramic. The time and temperature for the exposure as well as that necessary for the ceramification are generally those described above.

In a typical procedure to produce a cured coating, a substrate is coated with the Si—H containing resin and solvent in a manner which ensures that at least 5 volume % of the solvent remains in the coating. The coating is then exposed to the basic catalyst and water, and the solvent is evaporated. The coated substrate is placed in a convection oven, which is filled with an inert gas such as nitrogen. The temperature in the oven is then raised to the desired level (such as about 450° C.) and maintained for the desired time under inert atmosphere (such as about 5 minutes to about 2 hours).

A thermally cured film formed as described above contains a 20–60% SiH bond density remaining and has a dielectric constant of between about 1.1 and 3.5. It can have an elastic modulus of about 2–3 GPa when the dielectric constant is about 2.0.

Another method of making such a porous network coating is disclosed in U.S. Pat. No. 6,143,360 to Zhong, entitled METHOD FOR MAKING NANOPOROUS SILICONE RESINS FROM ALKYLHYDRIDOSILOXANE RESINS, which is incorporated herein by reference. The method comprises contacting a hydridosilicon containing resin with a 1-alkene comprising about 8 to 28 carbon atoms in the presence of a platinum group metal-containing hydrosilation catalyst, effecting formation of an alkylhydridosiloxane resin where at least 5 percent of the silicon atoms are substituted with at least one hydrogen atom and heating the alkylhydridosiloxane prepared at a temperature sufficient to effect curing and thermolysis of alkyl groups from the silicon atoms, thereby forming a nanoporous silicone resin.

Although coatings having low dielectric constants are desirable, it would be advantageous to have a coating with a higher elastic modulus.

In order to raise the elastic the elastic modulus of the film, whether cured or not, it is exposed to a plasma treatment. The plasma treatment can be done by radio frequency (RF), inductive coupled, RF capacitive coupled, helical resinator, microwave downstream, and microwave electron cyclotron resonance (ECR) plasma.

In a typical plasma process, the wafer is quickly heated in a rapid temperature ramp-up step to the desired temperature, and the wafer is plasma treated.

The exact conditions for the plasma treatment depend upon what type of plasma treatment is being used. Examples of typical microwave plasma treatment conditions are shown below.

Microwave Plasma Power: 1000 W–2000 W
Wafer Temperature: 80° C.–350° C.
Process Pressure: 1.0 torr–3.0 torr
Plasma Treatment Time: >15 seconds
Plasma Gases: $H_2/N_2/CF_4/O_2$
$O_2$ flow rate 0–4000 sccm
$CF_4$ flow rate: 0–400 sccm
Forming Gas (FG) (5% $H_2$/95% $N_2$) flow rate: 0–4000 sccm The plasma treated porous network coatings showed a significant increase in elastic modulus. The increase in the elastic modulus is preferably greater than 50%, and more preferably greater than 100%, when compared to the elastic modulus of the starting material.

The plasma treated coatings of the present invention have improved chemical stability and improved dimensional stability. By improved chemical stability, we mean that the coatings are more resistant to chemicals such as cleaning solutions and chemical polishing solutions, and plasma damaging during photoresist ashing and dry etching processes.

However, plasma treatment can generate a notable amount of polar species in the film, resulting in a higher dielectric constant.

The plasma treated coatings can be annealed in a Rapid Thermal Processing (RTP) chamber in order to reduce the dielectric constant. A typical RTP process includes an $N_2$ pre-purge to minimize oxygen residue in the chamber, followed by a rapid temperature ramp-up to the desired temperature. The plasma treated coating is then annealed at the temperature for a sufficient time, and cooled to about 100° C.

Typical operating conditions for the RTP process are shown below.

Pre-purge time: >30 sec
Ramp rate: 150° C./sec
Wafer Temperature: 350–450° C.
Annealing Time: >120 seconds The dielectric constant of the annealed, plasma treated coatings is reduced as compared to the plasma treated coatings. Under certain conditions, it can approach the dielectric constant of the starting material.

In addition, the elastic modulus of the annealed, plasma treated coating is significantly improved as compared to the initial elastic modulus. The increase in elastic modulus is preferably greater than 50%, and more preferably greater than 100%. While in some cases the elastic modulus is decreased when compared to the plasma treated coating, it is still significantly higher than the initial elastic modulus.

EXAMPLE 1

Two solutions of hydrogen silsesquioxane resin, were prepared by the method of Collins et al., U.S. Pat. No. 3,615,272. Solution 1 contained 12.7% resin by weight, 9.7% tetradecane ($C_{14}H_{30}$) by weight, and 77.6% methylpropyl ketone (MPK, $CH_3COC_3H_7$) by weight. Solution 2 contained 21.7% resin by weight, 16.6% tetradecane, and 61.7% methylisobutylketone (MIBK) by weight.

Solution 1 was spin coated on 8 inch single crystal Si wafers on a commercially available coater manufactured by Tokyo Electron Ltd. (TEL), Clean Track ACT™ 8 (ACT8) with optional Dielectric Aging Chamber (DAC).

After spinning the solution onto a wafer, the wafer was placed into the DAC where it was exposed to a moist ammonia atmosphere for 45 to 50 seconds at room temperature. After coating, the wafer was placed on a hotplate, which was preset to a temperature of 150° C., for one minute to remove the remaining solvent. The wafer was then removed from the coater and thermally treated by placing the wafer in a quartz tube furnace (QTF). The furnace was purged with inert atmosphere ($N_2$, with ultra-low $O_2$ content, <10 ppm) during cure. Cure temperature ranged from 400 to 450° C., and the time at temperature was 60 minutes. The thickness of the coating resulting from solution 1 averaged 5000 Å.

Solution 2 was spin coated on 8 inch single crystal Si wafers, on a commercially available DNS 80A spin coater. After spinning the solution onto a wafer, the wafer was placed into a dielectric aging chamber (made in-house) where it was exposed to a moist ammonia atmosphere for 90 seconds at room temperature. After coating, the wafers were placed on a hotplate, which was preset to a temperature of 150° C., for one minute to remove the remaining solvent. The wafer was then removed from the coater and thermally treated by placing the wafer in a quartz tube furnace (QTF). The furnace was purged with inert atmosphere ($N_2$, with ultra-low $O_2$ content, <10 ppm) during cure. Cure temperature ranged from 400 to 450° C., and the time at temperature was 60 minutes. The thickness of the coating resulting from solution 2 averaged 10,000 Å.

The thermally cured coatings with 40–55% SiH, a dielectric constant about 2.0 (5000 Å coating) and about 2.2 (10,000 Å coating) and an elastic modulus of about 3.0 GPa were treated with a microwave plasma under various conditions of time, temperature, microwave power, type of gas, and gas flow rate.

The testing was done in an Eaton FusionGemini® ES microwave-downstream plasma asher. The system utilizes a 2.45 GHz source that efficiently couples microwave energy into the plasma, creating a high concentration of active radicals while minimizing energetic ions that might cause damage to the low dielectric constant materials. The system also employs fast ramping radiant heat heating to allow a wide range of process temperatures enabling multiple temperature process steps. This system is described in U.S. Pat. No. 5,961,851.

The process conditions applied to the plasma treatment are shown below:

Microwave Plasma Power: 1500 W–1800 W

Wafer Temperature: 800° C.–280° C.

Process Pressure: 1.0 torr–3.0 torr

Plasma Treatment Time: 15 seconds–120 seconds

Plasma Gases: $H_2/N_2/CF_4/O_2$ $O_2$ flow rate 0–2510 sccm $CF_4$ flow rate: 0–400 sccm FG (5% $H_2$/95% $N_2$) flow rate: 0–3500 sccm The results of this testing are shown in Tables 1–5.

TABLE 1

Thermally Cured Films with 40% SiH and a thickness of 5000 A at 450° C.

| | | | Plasma treatment | | | | | | | |
|---|---|---|---|---|---|---|---|---|---|---|
| Run | Time (sec) | Temp (° C.) | Power (watts) | O2 (sccm) | CF4 (sccm) | Pressure (torr) | FG (sccm) | R.I. @ 633 nm | SiH (%) | Modulus (GPa) |
| 1 | 30 | 120 | 1800 | 0 | 15 | 1.2 | 3485 | 1.241 | 0 | 12.0 |
| 2 | 30 | 200 | 1800 | 0 | 15 | 1.2 | 3485 | 1.235 | 0 | 12.6 |
| 3 | 30 | 280 | 1800 | 0 | 15 | 1.2 | 3485 | 1.232 | 0 | 13.2 |
| 4 | 30 | 120 | 1800 | 0 | 150 | 1.2 | 3350 | 1.250 | 0 | 13.3 |
| 5 | 30 | 200 | 1800 | 0 | 150 | 1.2 | 3350 | 1.241 | 0 | 12.9 |
| 6 | 30 | 280 | 1800 | 0 | 150 | 1.2 | 3350 | 1.237 | 0 | 15.1 |
| 7 | 30 | 120 | 1800 | 200 | 150 | 1.2 | 3150 | 1.222 | 0 | 13.8 |
| 8 | 30 | 200 | 1800 | 200 | 150 | 1.2 | 3150 | 1.222 | 0 | 13.4 |
| 9 | 30 | 280 | 1800 | 200 | 150 | 1.2 | 3150 | 1.224 | 0 | 10.6 |
| 10 | 30 | 120 | 1800 | 200 | 15 | 1.2 | 3285 | 1.227 | 0 | 11.0 |
| 11 | 30 | 200 | 1800 | 200 | 15 | 1.2 | 3285 | 1.230 | 0 | 10.8 |
| 12 | 30 | 280 | 1800 | 200 | 15 | 1.2 | 3285 | 1.229 | 0 | 10.1 |

R.I. is refractive index.

TABLE 2

Thermally Cured Films with 55% SiH and a thickness of 5000 A at 450° C.

| | | | Plasma treatment | | | | | | | |
|---|---|---|---|---|---|---|---|---|---|---|
| Run | Time (sec) | Temp (° C.) | Power (watts) | O2 (sccm) | CF4 (sccm) | Pressure (torr) | FG (sccm) | R.I. @ 633 nm | SiH (%) | Modulus (GPa) |
| 1 | 30 | 120 | 1800 | 0 | 150 | 1.2 | 3350 | 1.265 | 0 | 13.0 |
| 2 | 30 | 120 | 1800 | 0 | 150 | 1.2 | 3350 | 1.266 | 0 | 14.7 |
| 3 | 30 | 120 | 1800 | 0 | 150 | 1.2 | 3350 | 1.268 | 0 | 13.8 |

TABLE 2-continued

Thermally Cured Films with 55% SiH and a thickness of 5000 A at 450° C.

| | | | | Plasma treatment | | | | | | |
|---|---|---|---|---|---|---|---|---|---|---|
| Run | Time (sec) | Temp (° C.) | Power (watts) | O2 (sccm) | CF4 (sccm) | Pressure (torr) | FG (sccm) | R.I. @ 633 nm | SiH (%) | Modulus (GPa) |
| 4 | 30 | 80 | 1800 | 0 | 150 | 1.2 | 3350 | 1.267 | 0 | 14.5 |
| 5 | 30 | 160 | 1800 | 0 | 150 | 1.2 | 3350 | 1.272 | 0 | 15.5 |
| 6 | 15 | 120 | 1800 | 0 | 150 | 1.2 | 3350 | 1.262 | 0 | 13.6 |
| 7 | 30 | 270 | 1800 | 0 | 150 | 1.2 | 3350 | 1.276 | 0 | 15.4 |

R.I. is refractive index.

TABLE 3

Thermally Cured Films with 55% SiH and a thickness of 5000 A at 450° C.

| | | | | Plasma treatment | | | | | | |
|---|---|---|---|---|---|---|---|---|---|---|
| Run | Time (sec) | Temp (° C.) | Power (watts) | O2 (sccm) | CF4 (sccm) | Pressure (torr) | FG (sccm) | R.I. @ 633 nm | SiH (%) | Modulus (GPa) |
| 1 | 30 | 120 | 1500 | 0 | 150 | 2.1 | 3350 | 1.264 | 0 | 15.9 |
| 2 | 30 | 120 | 1500 | 0 | 150 | 2.1 | 3350 | 1.267 | 0 | 14.1 |

R.I. is refractive index.

TABLE 4

Thermally Cured Films with 40% SiH and a thickness of 10000 A at 450° C.

| | | | | Plasma treatment | | | | | | |
|---|---|---|---|---|---|---|---|---|---|---|
| Run | Time (sec) | Temp (° C.) | Power (watts) | O2 (sccm) | CF4 (sccm) | Pressure (torr) | FG (sccm) | R.I. @ 633 nm | SiH (%) | Modulus (GPa) |
| 1 | 60 | 270 | 1800 | 0 | 0 | 1.0 | 2000 | 1.264 | 12 | 6.3 |
| 5 | 20 | 200 | 1800 | 2510 | 5 | 1.5 | 240 | 1.267 | 0 | 6.6 |

R.I. is refractive index.

TABLE 5

Thermally Cured Films with 40% SiH and a thickness of 10000 A at 400° C.

| | | | | Plasma treatment | | | | | | |
|---|---|---|---|---|---|---|---|---|---|---|
| Run | Time (sec) | Temp (° C.) | Power (watts) | O2 (sccm) | CF4 (sccm) | Pressure (torr) | FG (sccm) | R.I. @ 633 nm | SiH (%) | Modulus (GPa) |
| 1 | 60 | 270 | 1800 | 0 | 0 | 1.0 | 2000 | 1.256 | 10 | 6.9 |
| 5 | 20 | 200 | 1800 | 2510 | 5 | 1.5 | 240 | 1.262 | 0 | 6.4 |

R.I. is refractive index.

The results of the testing shown in Tables 1–5 demonstrate that the coatings treated with the microwave plasma were either completely converted to porous silica or the amount of SiH bonds was significantly reduced as compared to the initial level of SiH bonds. The elastic modulus of the coatings were greatly improved (over 100%) under a wide variety of process conditions.

EXAMPLE 2

Solution 1 (described in Example 1) was spin coated on 8 inch single crystal Si wafers on a commercially available coater manufactured by Tokyo Electron Ltd. (TEL), Clean Track ACT™ 8 (ACT8) with optional Dielectric Aging Chamber (DAC).

After spinning the solution onto a wafer, the wafer was placed into the DAC where it was exposed to a moist ammonia atmosphere for 45 to 50 seconds at room temperature. After coating, the wafer was then placed on a hotplate, which was preset to a temperature of 150° C., for one minute to remove the remaining solvent.

These film wafers, which were not thermally cured, were also treated by a microwave plasma under various conditions of time, temperature, microwave power, type of gas, and gas flow rate. The Eaton FusionGemini® ES microwave-downstream plasma asher described above was used to plasma treat the uncured coatings. The process conditions for the plasma treatment were the same as those used for the thermally cured coatings. The results of the testing are shown in Table 6.

TABLE 6

Films (No thermal cure) with 55% SiH and a thickness of 5000 A

| | | | Plasma treatment | | | | | | | |
|---|---|---|---|---|---|---|---|---|---|---|
| Run | Time (sec) | Temp (° C.) | Power (watts) | O2 (sccm) | CF4 (sccm) | Pressure (torr) | FG (sccm) | SiH (%) | R.I. @ 633 nm | Modulus (GPa) |
| 17 | 30 | 120 | 1800 | 0 | 150 | 1.2 | 3350 | 0 | 1.288 | 14.7 |
| 19 | 30 | 170 | 1800 | 0 | 150 | 1.2 | 3350 | 0 | 1.289 | 16.1 |
| 23 | 30 | 270 | 1800 | 0 | 150 | 1.2 | 3350 | 0 | 1.286 | 16.3 |

R.I. is refractive index.

These coatings were completely converted to porous silica and the elastic modulus was significantly increased. They had a higher elastic modulus than the thermally cured coating after similar plasma treatment. However, the thermal budget of plasma processing alone (without thermal curing) is much lower than that with thermal cure processing. Thus, plasma treating a coating without thermally curing it provides improved elastic modulus over thermally cured coatings and a much lower thermal budget.

EXAMPLE 3

Thermally cured coatings with 40–55% SiH and a modulus of about 3.0 GPa from Example 1 and coatings which not been thermally cured from Example 2 were annealed by RTP after the microwave plasma treatment under various conditions shown below.

Pre-purge time: >30 sec

Ramp rate: 150° C./sec

Wafer Temperature: 350–450° C.

Annealing Time: >120 seconds

The results are shown in Tables 7–11.

TABLE 7

Thermally Cured Films with 40% SiH and a thickness of 5000 A at 450° C.

| | | | Plasma treatment | | | | | | | | | RTP Temp (C.)/ Time (min)/ N2 | | | |
|---|---|---|---|---|---|---|---|---|---|---|---|---|---|---|---|
| Run | Time (sec) | Temp (° C.) | Power (watts) | O2 (sccm) | CF4 (sccm) | Pressure (torr) | FG (sccm) | SiH (%) | R.I. @ 633 nm | DK @ 1 Mhz | Modulus (GPa) | | R.I. @ 633 nm | DK @ 1 MHz | Modulus (GPa) |
| 1 | 30 | 200 | 1800 | 0 | 15 | 1.2 | 3485 | 0 | 1.235 | 3.79 | 12.6 | 450/2 | 1.211 | 3.38 | ND |
| 2 | 30 | 280 | 1800 | 0 | 15 | 1.2 | 3485 | 0 | 1.232 | 4.50 | 13.2 | 450/2 | 1.217 | 3.59 | ND |
| 3 | 30 | 120 | 1800 | 0 | 150 | 1.2 | 3350 | 0 | 1.250 | 3.10 | 13.3 | 450/2 | 1.194 | 2.09 | ND |
| 4 | 30 | 200 | 1800 | 0 | 150 | 1.2 | 3350 | 0 | 1.241 | 3.56 | 12.9 | 450/2 | 1.199 | 2.32 | ND |
| 5 | 30 | 280 | 1800 | 0 | 150 | 1.2 | 3350 | 0 | 1.237 | 4.04 | 15.1 | 450/2 | 1.208 | 2.61 | ND |
| 6 | 30 | 120 | 1800 | 200 | 150 | 1.2 | 3150 | 0 | 1.222 | 3.32 | 13.8 | 450/2 | 1.218 | 3.28 | ND |
| 7 | 30 | 200 | 1800 | 200 | 150 | 1.2 | 3150 | 0 | 1.222 | 6.17 | 13.4 | 450/2 | 1.222 | 3.64 | ND |
| 8 | 30 | 280 | 1800 | 200 | 150 | 1.2 | 3150 | 0 | 1.224 | 4.28 | 10.6 | 450/2 | 1.224 | 6.38 | ND |
| 9 | 30 | 200 | 1800 | 200 | 15 | 1.2 | 3285 | 0 | 1.230 | 5.43 | 10.8 | 450/2 | 1.229 | 4.91 | ND |

R.I. is refractive index.
DK is dielectric constant.
ND means not determined.

TABLE 8

Thermally Cured Films with 55% SiH and a thickness of 5000 A at 450° C.

| | | | Plasma treatment | | | | | | | | | RTP Temp (C.)/ Time (min)/ N2 | | | |
|---|---|---|---|---|---|---|---|---|---|---|---|---|---|---|---|
| Run | Time (sec) | Temp (° C.) | Power (watts) | O2 (sccm) | CF4 (sccm) | Pressure (torr) | FG (sccm) | SiH (%) | R.I. @ 633 nm | DK @ 1 Mhz | Modulus (GPa) | | R.I. @ 633 nm | DK @ 1 MHz | Modulus (GPa) |
| 1 | 30 | 120 | 1500 | 0 | 150 | 2.1 | 3350 | 0 | 1.264 | no | 18.2 | 450/2 | 1.235 | 2.35 | 17.6 |
| 2 | 30 | 120 | 1500 | 0 | 150 | 2.1 | 3350 | 0 | 1.267 | 6.04 | ND | 450/2 | 1.233 | 2.22 | 12.6 |
| 3 | 40 | 120 | 1500 | 0 | 150 | 2.1 | 3350 | 0 | 1.271 | 5.78 | ND | 450/2 | 1.232 | 2.38 | 12.9 |
| 4 | 40 | 160 | 1200 | 0 | 200 | 1.2 | 3350 | 0 | 1.268 | 3.77 | ND | 450/2 | 1.205 | 2.39 | 12.7 |
| 5 | 30 | 120 | 1500 | 0 | 150 | 2.1 | 3350 | 0 | 1.267 | 4.28 | 13.2 | 450/2 | 1.238 | 2.35 | 13.6 |

TABLE 8-continued

Thermally Cured Films with 55% SiH and a thickness of 5000 A at 450° C.

| | Plasma treatment | | | | | | | | | | | RTP Temp (C.)/ Time (min)/ N2 | | | |
|---|---|---|---|---|---|---|---|---|---|---|---|---|---|---|---|
| Run | Time (sec) | Temp (° C.) | Power (watts) | O2 (sccm) | CF4 (sccm) | Pressure (torr) | FG (sccm) | SiH (%) | R.I. @ 633 nm | DK @ 1 Mhz | Modulus (GPa) | | R.I. @ 633 nm | DK @ 1 MHz | Modulus (GPa) |
| 6 | 20 | 80 | 1200 | 0 | 200 | 1.2 | 3350 | 0 | 1.259 | 2.98 | ND | 450/2 | 1.210 | 2.34 | 12.7 |
| 9 | 40 | 80 | 1200 | 0 | 100 | 1.2 | 3350 | 0 | 1.26 | 3.89 | ND | 450/2 | 1.202 | 2.35 | 13.8 |
| 10 | 30 | 160 | 1500 | 0 | 150 | 2.1 | 3350 | 0 | 1.263 | 4.17 | ND | 450/2 | 1.211 | 2.33 | 12.5 |
| 11 | 30 | 120 | 1500 | 0 | 150 | 2.1 | 3350 | 0 | 1.266 | no | ND | 450/2 | 1.247 | 2.39 | 13.6 |
| 16 | 20 | 80 | 1200 | 0 | 100 | 3 | 3350 | 0 | 1.272 | no | ND | 450/2 | 1.200 | 2.37 | 14.6 |
| 18 | 40 | 80 | 1200 | 0 | 200 | 3 | 3350 | 0 | 1.284 | no | ND | 450/2 | 1.233 | 2.42 | 15.5 |
| 19 | 30 | 80 | 1500 | 0 | 150 | 2.1 | 3350 | 0 | 1.285 | no | ND | 450/2 | 1.223 | 2.19 | 16.2 |
| 23 | 20 | 160 | 1800 | 0 | 200 | 1.2 | 3350 | 0 | 1.265 | 3.28 | ND | 450/2 | 1.227 | 2.37 | 13.4 |
| 24 | 30 | 120 | 1800 | 0 | 150 | 2.1 | 3350 | 0 | 1.241 | 3.23 | ND | 450/2 | 1.238 | 2.38 | 13.5 |
| 25 | 20 | 160 | 1800 | 0 | 100 | 3 | 3350 | 0 | 1.263 | 3.59 | ND | 450/2 | 1.256 | 2.34 | 13.2 |
| 27 | 30 | 120 | 1500 | 0 | 150 | 2.1 | 3350 | 0 | 1.264 | no | ND | 450/2 | 1.266 | 2.34 | 13.0 |
| 32 | 30 | 120 | 1500 | 0 | 150 | 2.1 | 3350 | 0 | 1.26 | no | ND | 450/2 | 1.271 | 2.34 | 13.5 |
| 1 | 30 | 120 | 1500 | 0 | 150 | 2.1 | 3350 | 0 | 1.264 | no | 18.2 | 350/2 | 1.235 | 2.35 | 11.0 |
| 5 | 30 | 120 | 1500 | 0 | 150 | 2.1 | 3350 | 0 | 1.267 | 4.28 | 13.2 | 350/2 | 1.238 | 2.35 | 11.1 |

R.I. is refractive index.
DK is dielectric constant.
ND means not determined.
No means not able to be determined.

TABLE 9

Thermally Cured Films with 40% SiH and a thickness of 10000 A at 450° C.

| | Plasma treatment | | | | | | | | | | | RTP Temp (C.)/ Time (min)/ N2 | | |
|---|---|---|---|---|---|---|---|---|---|---|---|---|---|---|
| Run | Time (sec) | Temp (° C.) | Power (watts) | O2 (sccm) | CF4 (sccm) | Pressure (torr) | FG (sccm) | SiH (%) | R.I. @ 633 nm | DK @ 1 Mhz | Modulus (GPa) | | DK @ 1 MHz | Modulus (GPa) |
| 1 | 60 | 270 | 1800 | 0 | 0 | 1.0 | 2000 | 0 | 1.264 | 4.28 | 6.5 | 450/2 | 2.75 | ND |
| 3 | 60 | 270 | 1800 | 0 | 100 | 1.0 | 2000 | 0 | 1.247 | 3.41 | ND | 450/2 | 2.30 | 6.8 |

R.I. is refractive index.
DK is dielectric constant.
ND means not determined.
No means not able to be determined.

TABLE 10

Thermally Cured Films with 40% SiH and a thickness of 10000 A at 400° C.

| | Plasma treatment | | | | | | | | | | | RTP Temp (C.)/ Time (min)/ N2 | | |
|---|---|---|---|---|---|---|---|---|---|---|---|---|---|---|
| Run | Time (sec) | Temp (° C.) | Power (watts) | O2 (sccm) | CF4 (sccm) | Pressure (torr) | FG (sccm) | SiH (%) | R.I. @ 633 nm | DK @ 1 Mhz | Modulus (GPa) | | DK @ 1 MHz | Modulus (GPa) |
| 1 | 60 | 270 | 1800 | 0 | 0 | 1.0 | 2000 | 10 | 1.256 | 5.27 | 6.9 | 450/2 | 3.92 | ND |
| 3 | 60 | 270 | 1800 | 0 | 100 | 1.0 | 2000 | 0 | 1.224 | 3.74 | ND | 450/2 | 2.27 | 5.8 |

R.I. is refractive index.
DK is dielectric constant.
ND means not determined.
No means not able to be determined.

TABLE 11

Films (No thermal cure) with 55% SiH and a thickness of 5000 A

| | Plasma treatment | | | | | | | | | | RTP Temp (C.)/ Time | | | |
|---|---|---|---|---|---|---|---|---|---|---|---|---|---|---|
| Run | Time (sec) | Temp (° C.) | Power (watts) | O2 (sccm) | CF4 (sccm) | Pressure (torr) | FG (sccm) | SiH (%) | R.I. @ 633 nm | DK @ 1 Mhz | Modulus (GPa) | (min)/ N2 | R.I. @ 633 nm | DK @ 1 MHz | Modulus (GPa) |
| 17 | 30 | 120 | 1800 | 0 | 150 | 1.2 | 3350 | 0 | 1.288 | 4.65 | 14.7 | 450/2 | 1.213 | 2.68 | ND |
| 19 | 30 | 170 | 1800 | 0 | 150 | 1.2 | 3350 | 0 | 1.289 | 7.65 | 16.1 | 450/2 | 1.219 | 2.82 | ND |
| 23 | 30 | 270 | 1800 | 0 | 150 | 1.2 | 3350 | 0 | 1.286 | 3.48 | 16.3 | 450/2 | 1.237 | 2.88 | ND |

R.I. is refractive index.
DK is dielectric constant.
ND means not determined.
No means not able to be determined.

These results show that the plasma treated coatings were completely converted to porous silica or to a silica-like material. The elastic modulus was improved by the plasma treatment, but the dielectric constant was raised. The subsequent RTP annealing lowered the dielectric constant while maintaining a significantly improved elastic modulus as compared to the initial modulus of the original coating. Although the elastic modulus dropped somewhat from the elastic modulus of the plasma treated coatings in some cases, it remained significantly higher than the initial elastic modulus, still showing greater than 100% improvement.

EXAMPLE 4

A thermally cured coating with 40–55% SiH and a modulus of about 3.0 GPa was treated with plasma under the conditions listed below.

| | |
|---|---|
| Plasma Power | 400 watts |
| Wafer Temperature | Room Temperature |
| Process Pressure | 1.2 torr |
| Plasma Treatment Time | 120 seconds |
| Plasma Gases | Air |

The testing was done in a an Branson/IPC plasma system (model IPC S4000 Series). The system utilizes a radio frequency (RF) source at 13.65 MHz which efficiently couples the RF energy into the plasma, creating a high concentration of active radicals.

The results of this testing are shown in Table 12

EXAMPLE 5

A solution of alkylhydridosiloxane resin, prepared by the method of Zhong, U.S. Pat. No. 6,143,360, with a resin composition of $\{HSiO_{3/2}\}_{33.5}\{RSiO_{3/2}\}_{21.5}\{SiO_{4/2}\}_{45}$ where R is equal to n-octadecyl, containing 16.3% resin by weight and 83.7% isobutyl isobutyrate by weight was continuously filtered through a 2.0 micrometer filter for 40 minutes prior to spin coating. Films were spun onto 8 inch single crystal Si wafers. Spin coating was performed on a Karl Suss RC8 spin coater. After spinning, the coated wafers were placed in a quartz tube furnace for thermal cure. The furnace was purged with nitrogen prior to ramping to achieve an oxygen content less than 10 ppm. The furnace was ramped to 450° C. at 25° C./min with a 2 hour hold at 450° C. Samples were allowed to cool to below 100° C. under flowing nitrogen before removal from the furnace. The coatings before plasma treatment had a dielectric constant of about 1.9 and an elastic modulus of about 1.8 GPa.

The plasma treatment was done in an Eton Fusion/Gemini® ES microwave-downstream plasma asher described above. The process conditions applied to the plasma treatment are shown below:

Microwave Plasma Power: 1800 W
Wafer Temperature: 120° C.–2800° C.
Process Pressure: 2.1 torr
Plasma Treatment Time: 30 seconds
Plasma Gases: $H_2/N_2/CF_4/O_2$
$O_2$ flow rate 0 sccm
$CF_4$ flow rate: 150 sccm
FG (5% $H_2$/95% $N_2$) flow rate: 3350 sccm

TABLE 12

Thermally Cured Films with 55% SiH and a thickness of 5000 A at 450° C. treated by radio frequency (RF) plasma with a BRANSON/IPC

| | Plasma treatment | | | | | | | | | |
|---|---|---|---|---|---|---|---|---|---|---|
| Run | Time (sec) | Temp (° C.) | Power (watts) | Air (unit) | CF4 (sccm) | Pressure (torr) | FG (sccm) | SiH (%) | R.I. @ 633 nm | Modulus (GPa) |
| 1 | 120 | room | 400 | 50 | 0 | 1.2 | 0 | 0 | 1.236 | 7.4 |

R.I. is refractive index.

The results of this testing are shown in Table 13.

TABLE 13

Thermally Cured Films with a thickness of 7000 A at 450° C.

| | Plasma treatment | | | | | | | | |
|---|---|---|---|---|---|---|---|---|---|
| Run | Time (sec) | Temp (° C.) | Power (watts) | O2 (sccm) | CF4 (sccm) | Pressure (torr) | FG (sccm) | R.I. @ 633 nm | SiH (%) | Modulus (GPa) |
| 1 | 30 | 120 | 1800 | 0 | 150 | 2.1 | 3350 | 1.339 | 0 | 3.6 |
| 2 | 30 | 200 | 1800 | 0 | 150 | 2.1 | 3350 | 1.159 | 0 | 3.1 |
| 3 | 30 | 280 | 1800 | 0 | 150 | 2.1 | 3350 | 1.187 | 0 | 5.4 |

R.I. is refractive index.

The results show that the coatings treated with the microwave plasma were completely converted to porous silica. The elastic modulus of the coating was significantly improved under a wide variety of process conditions.

EXAMPLE 6

The thermally cured coatings obtained from Example 5 were annealed by RTP after the microwave plasma treatment under various conditions. The samples were nitrogen (ultra low $O_2$) purged for 30 seconds and ramped to the desired temperature.

The process conditions applied to the RTP were in the following ranges:

Pre-purge time: >30 sec
Ramp rate: 150° C./sec
Wafer Temperature: 350–450° C.
Annealing Time: >120 seconds
The results are shown in Table 14.

These coatings posses low defect density and are useful on electronic devices as dielectric layers in, for example, multilayer devices.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method of making a plasma treated coating comprising:

providing a thermally cured porous network coating produced from a resin containing at least 2 Si—H groups, wherein the porous network coating has an initial dielectric constant and an initial elastic modulus; and plasma treating the porous network coating to reduce an amount of SiH bonds and to provide a plasma treated coating having a second dielectric constant which is

TABLE 14

Thermally Cured Films with 40% SiH and a thickness of 5000 A at 450° C.

| | Plasma treatment | | | | | | | | | | RTP Temp (C.)/ | | |
|---|---|---|---|---|---|---|---|---|---|---|---|---|---|
| Run | Time (sec) | Temp (° C.) | Power (watts) | O2 (sccm) | CF4 (sccm) | Pressure (torr) | FG (sccm) | SiH (%) | R.I. @ 633 nm | DK @ 1 Mhz | Modulus (GPa) | Time (min)/ N2 | DK @ 1 MHz | Modulus (GPa) |
| 1 | 30 | 120 | 1800 | 0 | 150 | 2.1 | 3350 | 0 | 1.339 | 2.87 | 3.6 | 450/2 | 2.04 | ND |
| 2 | 30 | 200 | 1800 | 0 | 150 | 2.1 | 3350 | 0 | 1.159 | 6.25 | 3.1 | 450/2 | 2.07 | ND |
| 3 | 30 | 280 | 1800 | 0 | 150 | 2.1 | 3350 | 0 | 1.187 | no | 5.4 | 450/2 | 2.34 | ND |

R.I. is refractive index.
DK is dielectric constant.
ND means not determined.
No means not able to be determined.

By the above methods, a thin (less than 5 microns) ceramic coating is produced on the substrate. The coating has an improved elastic modulus. Furthermore, with the annealing step, the coating can have an improved elastic modulus and a low dielectric constant.

The coating smooths the irregular surfaces of various substrates and has excellent adhesion. In addition, the coating may be covered by other coatings, such as further $SiO_2$ coatings, $SiO_2$/modifying ceramic oxide layers, silicon containing coatings, carbon containing coatings, and/or diamond like coatings.

greater than the initial dielectric constant, and a second elastic modulus which is greater than the initial elastic modulus.

2. The method of claim 1 further comprising annealing the plasma treated coating to provide an annealed, plasma treated coating having a third dielectric constant which is less than the second dielectric constant and a third elastic modulus which is greater than the initial elastic modulus.

3. The method of claim 2 wherein the plasma treated coating is annealed at a temperature in excess of or about 350° C.

4. The method of claim 2 wherein the plasma treated coating is annealed at a temperature in the range of about 350° C. to about 450° C.

5. The method of claim 2 wherein the plasma treated coating is annealed for at least or about 120 seconds.

6. The method of claim 1 wherein the second elastic modulus of the plasma treated coating is at least 50% greater than the initial elastic modulus.

7. The method of claim 1 wherein the second elastic modulus of the plasma treated coating is at least 100% greater than the initial elastic modulus.

8. The method of claim 2 wherein the third elastic modulus of the annealed, plasma treated coating is at least 50% greater that the initial elastic modulus.

9. The method of claim 2 wherein the third elastic modulus of the annealed, plasma treated coating is at least 100% greater than the initial elastic modulus.

10. The method of claim 1 wherein the thermally cured porous network coating is cured by heating to a temperature sufficient to convert the porous network coating into a ceramic.

11. The method of claim 10 wherein the thermally cured porous network coating is cured by heating to a temperature of about 50° C. to about 1000° C. for up to or about 6 hours.

12. The method of claim 11 wherein the thermally cured porous network coating is cured by heating to a temperature in the range of about 50° C. to about 500° C. for between 10 minutes and about 2 hours.

13. The method of claim 11 wherein the thermally cured porous network coating is cured by heating to a temperature in the range of about 350° C. to about 450° C. for between 10 minutes and about 1 hour.

14. The method of claim 1 wherein the thermally cured porous network coating is plasma treated for a time in the range of about 15 to about 120 seconds.

15. The method of claim 1 wherein the thermally cured porous network coating is plasma treated at a temperature less than or about 350° C.

16. The method of claim 1 wherein the thermally cured porous network coating is plasma treated at a temperature in the range of about 80° C. to about 280° C.

17. The method of claim 2 wherein the third dielectric constant of the annealed, plasma treated coating is in the range of from about 1.1 to about 3.5.

18. The method of claim 2 wherein the third elastic modulus of the annealed, plasma treated coating is greater than or about 4 GPa.

19. The method of claim 2 wherein the third elastic modulus of the annealed, plasma treated coating is greater than or about 10 GPa.

* * * * *

UNITED STATES PATENT AND TRADEMARK OFFICE
CERTIFICATE OF CORRECTION

PATENT NO.    : 6,576,300 B1                                     Page 1 of 1
DATED         : June 10, 2003
INVENTOR(S)   : Ivan Louis Berry, III et al.

It is certified that error appears in the above-identified patent and that said Letters Patent is hereby corrected as shown below:

Column 22,
Line 31, "resin containing at least" should be -- resin molecule containing at least --;

Column 23,
Line 15, "50% greater that the" should be -- 50% greater than the --.

Signed and Sealed this

Seventh Day of October, 2003

JAMES E. ROGAN
*Director of the United States Patent and Trademark Office*